(12) United States Patent
Ma et al.

(10) Patent No.: US 12,140,845 B2
(45) Date of Patent: Nov. 12, 2024

(54) DISPLAY PANEL AND DISPLAY DEVICE

(71) Applicant: WUHAN CHINA STAR OPTOELECTRONICS TECHNOLOGY CO., LTD., Wuhan (CN)

(72) Inventors: Tao Ma, Wuhan (CN); Fei Ai, Wuhan (CN); Zhilin Wu, Wuhan (CN)

( * ) Notice: Subject to any disclaimer, the term of this patent is extended or adjusted under 35 U.S.C. 154(b) by 0 days.

(21) Appl. No.: 17/976,805

(22) Filed: Oct. 30, 2022

(65) Prior Publication Data

US 2024/0094587 A1   Mar. 21, 2024

(30) Foreign Application Priority Data

Sep. 20, 2022   (CN) .......................... 202211144517.9

(51) Int. Cl.
*G02F 1/1368* (2006.01)
*G02F 1/1362* (2006.01)
*H10K 59/131* (2023.01)

(52) U.S. Cl.
CPC ...... *G02F 1/1368* (2013.01); *G02F 1/136286* (2013.01); *H10K 59/131* (2023.02)

(58) Field of Classification Search
None
See application file for complete search history.

(56) References Cited

U.S. PATENT DOCUMENTS

| 2012/0107983 A1* | 5/2012 | Choi | ........................ H01L 21/77 |
| | | | 257/E33.012 |
| 2017/0373098 A1* | 12/2017 | Hirano | ................... H01L 27/124 |
| 2022/0223629 A1* | 7/2022 | Song | ..................... H01L 27/1251 |

* cited by examiner

*Primary Examiner* — Shan Liu

(57) ABSTRACT

The present disclosure provides a display panel and a display device. The display panel includes a thin film transistor; and further includes a substrate; a first metal layer disposed on the substrate and including a gate of the thin film transistor; an active layer disposed on a side of the first metal layer away from the substrate and including an active portion of the thin film transistor; a spacer layer disposed on a side of the active layer away from the first metal layer and including a plurality of contact holes; a second metal layer disposed on a side of the spacer layer away from the active layer and including a source and a drain of the thin film transistor; an orthographic projection of the gate electrode on the substrate covers an orthographic projection of at least part of the contact holes on the substrate.

20 Claims, 5 Drawing Sheets

DISPLAY PANEL AND DISPLAY DEVICE

CROSS-REFERENCE TO RELATED APPLICATION

This application claims priority to and the benefit of Chinese Patent Application No. 202211144517.9, filed on Sep. 20, 2022, the entire content of which is hereby incorporated by reference.

FIELD OF INVENTION

The present disclosure relates to a display technology field, and in particular, to a display panel and a display device having the display panel.

BACKGROUND OF INVENTION

At present, thin film transistors (TFTs) are the main driving elements in a liquid crystal display device (LCD) and an active matrix/organic light-emitting diode display device (AMOLED), and are directly related to the development direction of high-performance flat panel display device. There are a plurality of materials for preparing the active layer of the thin film transistor. The low-temperature poly-silicon (LTPS) material is one of the preferable materials. The low-temperature poly-silicon has a high carrier mobility due to the regular atomic arrangement of the low-temperature poly-silicon. For the voltage-driven liquid crystal display device, since the low-temperature poly-silicon thin film transistor has a high mobility, the thin film transistor having a relatively small volume can be used to realize the deflection driving of the liquid crystal molecules, thereby greatly reducing the volume occupied by the thin film transistor, increasing the light transmission area, and obtaining a higher brightness and resolution. For current-driven active matrix/organic light-emitting diode display device, the low-temperature poly-silicon thin film transistor can better meet the requirements for the driving current.

Currently, a thin film transistor includes a bottom-gate type transistor and a top-gate type transistor. Compared with the top-gate type transistor, the bottom-gate type transistor may save a mask in a doping process of an active layer, and a bottom gate is located below the active layer, so that the preparation of a light shielding layer may be omitted, and the mask and the cost may be further saved. However, since the bottom gate is usually disposed corresponding to a channel region of the active layer, the shielding effect of the bottom gate on backside light of the active layer is limited, and it is difficult to ensure stability of the bottom-gate type transistor.

SUMMARY OF INVENTION

An embodiment of the present disclosure provides a display panel and a display device, which may improve the shielding effect of a first gate and a second gate on light and improve the stability of a first transistor and a second transistor.

An embodiment of the present disclosure provides a display panel including a thin film transistor;
the display panel further includes:
a substrate;
a first metal layer disposed on the substrate and including a gate of the thin film transistor;
an active layer disposed on a side of the first metal layer away from the substrate and including an active portion of the thin film transistor, wherein the active portion is disposed on a side of the gate away from the substrate;
a spacer layer disposed on a side of the active layer away from the first metal layer and including a plurality of contact holes; and
a second metal layer disposed on a side of the spacer layer away from the active layer and including a source and a drain of the thin film transistor, wherein the source and the drain are both connected to the active portion through the contact holes; and
wherein an orthographic projection of the gate on the substrate covers an orthographic projection of at least part of the contact holes on the substrate.

In an embodiment of the present disclosure, the display panel further includes a display region, and the thin film transistor includes a first transistor disposed within the display region;
the first metal layer includes a first gate of the first transistor, the active layer includes a first active portion of the first transistor, the second metal layer includes a first source and a first drain of the first transistor, the first active portion is located on a side of the first gate away from the substrate, the plurality of contact holes include a first contact hole and a second contact hole, the first source is connected to the first active portion through the first contact hole, and the first drain is connected to the first active portion through the second contact hole;
Wherein both an orthographic projection of the first contact hole on the substrate and an orthographic projection of the second contact hole on the substrate are located within a coverage area of an orthographic projection of the first gate on the substrate.

In an embodiment of the disclosure, an orthographic projection of the first active portion on the substrate is located within the coverage area of the orthographic projection of the first gate on the substrate.

In an embodiment of the present disclosure, the first metal layer further includes a scan line connected to the first gate, and a width of the first gate in a first direction is larger than a width of the scan line in the first direction, and the first direction is perpendicular to an extending direction of the scan line.

In an embodiment of the present disclosure, the display panel further includes a non-display region, and the thin film transistor includes a second transistor disposed within the non-display region; and
The first metal layer includes a second gate of the second transistor, the active layer includes a second active portion of the second transistor, the second metal layer includes a second source and a second drain of the second transistor, the second active portion is located on a side of the second gate away from the substrate, the plurality of contact holes include a third contact hole and a fourth contact hole, the second source is connected to the second active portion through the third contact hole, and the second drain is connected to the second active portion through the fourth contact hole; and
Wherein an orthographic projection of the second gate on the substrate covers an orthographic projection of at least part of the third contact hole on the substrate, and/or the orthographic projection of the second gate on the substrate covers an orthographic projection of at least part of the fourth contact hole on the substrate.

In an embodiment of the disclosure, a boundary of the orthographic projection of the second gate on the substrate does not extend beyond a boundary of an orthographic projection of the second active portion on the substrate.

In an embodiment of the present disclosure, the thin film transistor further includes a third transistor disposed in the non-display region, the first metal layer includes a third gate of the third transistor, the active layer includes a third active portion of the third transistor, the third active portion is disposed on a side of the third gate away from the substrate, and a boundary of an orthographic projection of the third gate on the substrate does not extend beyond a boundary of an orthographic projection of the third active portion on the substrate; and Wherein the second transistor and the third transistor share the second source or the second drain.

In an embodiment of the present disclosure, the second metal layer includes a third source of the third transistor, the third transistor shares the second drain with the second transistor, and the third active portion is connected to the second active portion; and Wherein an orthographic projection of the fourth contact hole on the substrate partially overlaps the orthographic projection of the second gate on the substrate, and the orthographic projection of the fourth contact hole on the substrate partially overlaps the orthographic projection of the third gate on the substrate.

In an embodiment of the present disclosure, the plurality of contact holes further include a fifth contact hole through which the third source is connected to the third active portion, and the orthographic projection of the third gate on the substrate covers an orthographic projection of at least part of the fifth contact hole on the substrate.

In an embodiment of the present disclosure, the second metal layer includes a third drain of the third transistor, the third transistor shares the second source with the second transistor, and the third active portion is connected to the second active portion; and;

Wherein an orthographic projection of the third contact hole on the substrate partially overlaps the orthographic projection of the second gate on the substrate, and the orthographic projection of the third contact hole on the substrate partially overlaps the orthographic projection of the third gate on the substrate.

In an embodiment of the present disclosure, the plurality of contact holes further include a sixth contact hole through which the third drain is connected to the third active portion, and the orthographic projection of the third gate on the substrate covers an orthographic projection of at least part of the sixth contact hole on the substrate.

In an embodiment of the disclosure, the second gate is spaced from the third gate.

In an embodiment of the present disclosure, the second transistor shares the second source with the third transistor, and an orthographic projection of the third contact hole on the substrate is located within a coverage area of the orthographic projection of the second gate on the substrate, or the orthographic projection of the third contact hole on the substrate is located within a coverage area of the orthographic projection of the third gate on the substrate.

In an embodiment of the present disclosure, the second transistor shares the second drain with the third transistor, and an orthographic projection of the fourth contact hole on the substrate is located within a coverage area of the orthographic projection of the second gate on the substrate, or the orthographic projection of the fourth contact hole on the substrate is located within a coverage area of the orthographic projection of the third gate on the substrate.

In accordance with the above object of the present disclosure, an embodiment of the present disclosure further provides a display device including the display panel.

Advantageous effects of embodiments of the present disclosure: the area of the gate located below the active portion is increased so that the orthographic projection of the gate on the substrate covers the orthographic projection of at least part of the contact holes of the source and the drain on the substrate, that is, the shielding range of the gate to the lower portion of the active portion is increased, thereby effectively reducing the photogenerated leakage current of the thin film transistor. In addition, since there is a step at the edge of the gate, if the active portion extends to the edge of the gate, it is easy to break at the step. In the present disclosure, the orthographic projection of the gate on the substrate is set to cover the orthographic projections of at least part of the contact holes of the source and the drain on the substrate, so that at least part of the contact holes of the source and the drain are located in the area corresponding to the upper surface of the gate and not located at the step, thereby ensuring that at least part of the active portions in contact with the source and the drain are not located at the step, improving the bonding yield of the source, the drain and the active portions, improving the signal transmission stability of the thin film transistor, and improving the display effect of the display panel.

DESCRIPTION OF DRAWINGS

The technical solution and other beneficial effects of the present disclosure will be apparent from the following detailed description of specific embodiments of the present disclosure, taken in conjunction with the accompanying drawings.

DETAILED DESCRIPTION OF EMBODIMENTS

Figure 1:
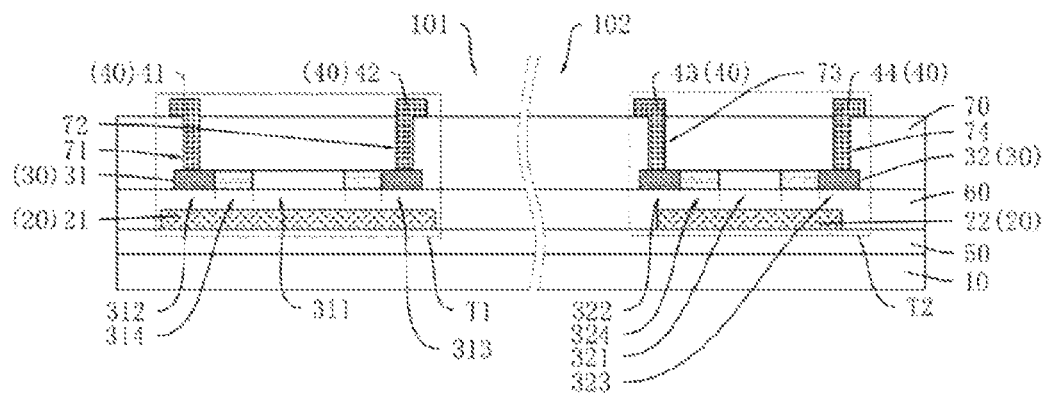
FIG. 1 is a schematic diagram of a structure of a display panel according to an embodiment of the present disclosure.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated by those skilled in the art.

An embodiment of the present disclosure provides a display panel. Referring to FIG. 1, the display panel includes a thin film transistor.

Further, the display panel further includes a substrate 10, a first metal layer 20, an active layer 30, a spacer layer 70, and a second metal layer 40.

The first metal layer 20 is disposed on the substrate 10 and includes a gate of a thin film transistor. The active layer 30 is disposed on a side of the first metal layer 20 away from the substrate 10, and includes an active portion of the thin film transistor, and the active portion is disposed on a side of the gate away from the substrate 10. The spacer layer 70 is disposed on a side of the active layer 30 away from the first metal layer 20 and includes a plurality of contact holes. The second metal layer 40 is disposed on a side of the spacer layer 70 away from the active layer 30 and includes a source and a drain of the thin film transistor, and both the source and the drain are connected to the active portion through the contact holes.

The orthographic projection of the gate on the substrate 10 covers at least part of the orthographic projection of the contact hole on the substrate 10.

In the practical application of the embodiment of the present disclosure, the area of the gate located below the active portion is increased so that the orthographic projection of the gate on the substrate 10 covers the orthographic projection of at least part of the contact holes of the source and the drain on the substrate 10, that is, the shielding range of the gate for the lower portion of the active portion is increased, thereby effectively reducing the photogenerated leakage current of the thin film transistor. In addition, since there is a step at the edge of the gate, if the active portion extends to the edge of the gate, it is easy to break at the step. In the present disclosure, the orthographic projection of the gate on the substrate 10 is set to cover the orthographic projections of at least part of the contact holes of the source and the drain on the substrate 10, so that at least part of the contact holes of the source and the drain are located in the area corresponding to the upper surface of the gate and not located at the step, thereby ensuring that at least part of the active portions in contact with the source and the drain are not located at the step, improving the bonding yield of the source, the drain and the active portions, improving the signal transmission stability of the thin film transistor, and improving the display effect of the display panel.

It should be noted that the display panel provided in the embodiment of the present disclosure includes a display region 101 and a non-display region 102 adjacent to the display region 101, and the thin film transistor includes a first transistor T1 located in the display region 101 and a second transistor T2 located in the non-display region 102. In the embodiment of the present disclosure, the gate areas of the first transistor T1 and the second transistor T2 are both increased to improve reduction of the photogenerated leakage current in the first transistor T1 and the second transistor T2, and the gate shielding ranges in the first transistor T1 and the second transistor T2 may be set differentially to further implement the display panel having a narrow bezel, and refer to the subsequent embodiments for details.

In an embodiment of the present disclosure, referring to FIG. 1, the display panel includes the display region 101, and the non-display region 102 adjacent to the display region 101, wherein the non-display region 102 may be specifically a frame region, and may include a GOA driving circuit region, and a wiring fan-out region at one side of the display panel.

The display panel further includes a substrate 10, a buffer layer 50 disposed on the substrate 10, a first metal layer 20 disposed on a side of the buffer layer 50 away from the substrate 10, a gate insulating layer 60 disposed on a side of the first metal layer 20 away from the buffer layer 50, an active layer 30 disposed on a side of the gate insulating layer 60 away from the buffer layer 50, a spacer layer 70 disposed on a side of the active layer 30 away from the gate insulating layer 60, and a second metal layer 40 disposed on a side of the spacer layer 70 away from the active layer 30.

Further, the display panel further includes a plurality of thin film transistors disposed on the substrate 10, and the plurality of thin film transistors includes the first transistor T1 disposed in the display region 101 and the second transistor T2 disposed in the non-display region 102. The first metal layer 20 includes a first gate 21 of the first transistor T1 and a second gate 22 of the second transistor T2, the active layer 30 includes a first active portion 31 of the first transistor T1 and a second active portion 32 of the second transistor T2, and the second metal layer 40 includes a first source 41 and a first drain 42 of the first transistor T1, and a second source 43 and a second drain 44 of the second transistor T2.

The first active portion 31 includes a first channel sub-region 311, a first source contact sub-region 312 and a first drain contact sub-region 313 located on both sides of the first channel sub-region 311, and two first lightly doped regions 314, and the two first lightly doped regions 314 are located between the first channel sub-region 311 and the first source contact sub-region 312, and between the first channel sub-region 311 and the first drain contact sub-region 313, respectively. The spacer layer 70 includes a plurality of contact holes, which include a first contact hole 71 provided corresponding to the first source contact sub-region 312 and a second contact hole 72 provided corresponding to the first drain contact sub-region 313. The first source 41 is connected to a portion of the first active portion 31 located in the first source contact sub-region 312 through the first contact hole 71, and the first drain 42 is connected to a portion of the first active portion 31 located in the first drain contact sub-region 313 through the second contact hole 72. Further, in the embodiment of the present disclosure, the orthographic projection of the first contact hole 71 on the substrate 10 and the orthographic projection of the second contact hole 72 on the substrate 10 are both located within the orthographic projection coverage of the first gate 21 on the substrate 10. Since the gate insulating layer 60 covers the first gate 21, the gate insulating layer 60 may form a protrusion (not shown) at the first gate 21, that is, the gate insulating layer 60 may form a step at the edge of the first gate 21. In the embodiment of the present disclosure, at least part of the first active portion 31 connected to the first source 41 and the first drain 42 is not located at the step formed at the edge of the first gate electrode 21, so that the bonding yield of the first source 41, the first drain 42 and the first active portion 31 is improved, the signal transmission stability of the first transistor T1 is improved, the display effect of the display panel is improved, the light shielding effect of the first gate 21 for the back side of the first active portion 31 (i.e., a side of the first active portion 31 close to the substrate 10) may be increased. Therefore, the phenomenon that the first active portion 31 in the first transistor T1 generates the photogenerated leakage current due to back light irradiation is effectively improved, the potential retention capability of the first transistor T1 is improved, the stability of the first transistor T1 is improved, the probability of crosstalk and flicker of the display panel is reduced, and the display effect of the display panel is improved.

Further, the orthographic projection of the first active portion 31 on the substrate 10 is within the coverage area of the orthographic projection of the first gate electrode 21 on the substrate 10, and thus the first active portion 31 is correspondingly located on a flat surface of a protrusion formed by the gate insulating layer 60 and does not cover the step of the gate insulating layer 60. That is, the embodiment of the present disclosure further improves the flatness of the film layer which forms the first active portion 31, and reduces the probability that the first active portion 31 is broken due to covering the step, so that the first source 41 and the first drain 42 may be well connected with the first active portion 31, thereby achieving good signal transmission, and further improving the electrical property and stability of the first transistor T1.

Figure 2:
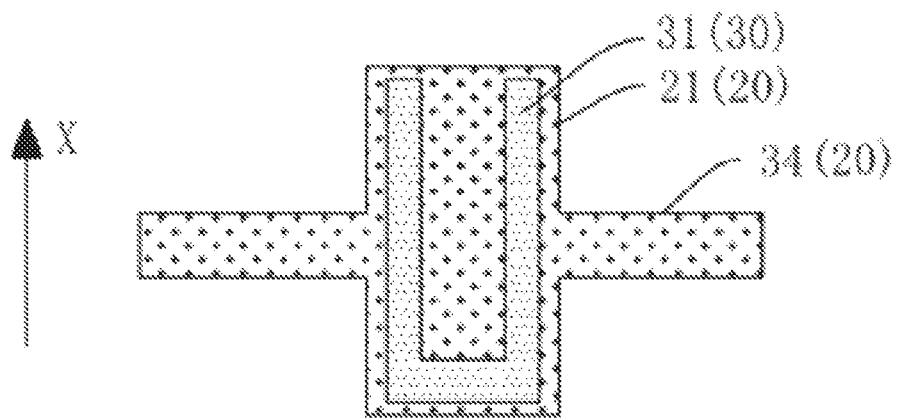
FIG. 2 is a schematic diagram of a planar structure of a first gate and a first active portion in a display panel according to an embodiment of the present disclosure.

It should be noted that, referring to FIGS. 1 and 2, the first metal layer 20 further includes a scan line 34 connected to the first gate 21 to provide a scan signal for the first gate 21. The width of the first gate 21 in the first direction X is greater than the width of the scan line 34 in the first direction X, and the first direction X is perpendicular to the extending direction of the scan line 34. In the embodiment of the present disclosure, the first gate 21 is integrally formed with the scan line 34, and the widths of the first gate 21 and the scan line 34 in the first direction X are differentially set, so that the area proportion of the scan line 34 is not increased while improving the shielding effect of the first gate 21 for the first active portion 31, that is, the aperture rate of the display panel is not decreased.

The second active portion 32 includes a second channel sub-region 321, a second source contact sub-region 322 and a second drain contact sub-region 323 located on both sides of the second channel sub-region 321, and two second lightly doped regions 324, and the two second lightly doped regions 324 are located between the second channel sub-region 321 and the second source contact sub-region 322, and between the second channel sub-region 321 and the second drain contact sub-region 323, respectively. The spacer layer 70 includes a third contact hole 73 provided corresponding to the second source contact sub-region 322 and a fourth contact hole 74 provided corresponding to the second drain contact sub-region 323, and the second source 43 is connected to the second active portion 32 located in the second source contact sub-region 322 through the third contact hole 73, and the second drain 44 is connected to the second active portion 32 located in the second drain contact sub-region 323 through the fourth contact hole 74. In addition, in the embodiment of the present disclosure, the orthographic projection of the second gate 22 on the active layer 30 covers the second channel sub-region 321, and the orthographic projection of the second gate 22 on the substrate 10 covers the orthographic projection of at least part of the third contact hole 73 on the substrate 10, and/or the orthographic projection of the second gate 22 on the substrate 10 covers the orthographic projection of at least part of the fourth contact hole 74 on the substrate 10, so that the light shielding effect of the second gate 22 for the back side of the second active portion 32 (i.e., a side of the second active portion 32 close to the substrate 10) may be increased, which effectively improves the phenomenon that the second active portion 32 in the second transistor T2 generates the photogenerated leakage current due to back light irradiation, improves the potential retention capability of the second transistor T2, and improves the stability of the second transistor T2. Further, the boundary of the orthographic projection of the second gate 22 on the active layer 30 is located in the second source contact sub-region 322 and the second drain contact sub-region 323, and the boundary of the orthographic projection of the second gate 22 on the substrate 10 does not pass the boundary of the orthographic projection of the second active portion 32 on the substrate 10. In the embodiment of the present disclosure, the coverage area of the second gate 22 does not exceed the coverage area of the second active portion 32, that is, the size and the occupied space of the second transistor T2 are not increased in the embodiment of the present disclosure. At present, the area of the non-display region 102 of the display panel is gradually reduced as the narrow bezel of the display panel is required. Therefore, in the embodiment of the present disclosure, on the basis of improving the stability of the second transistor T2, the narrow bezel of the display panel may be advantageously realized.

In an embodiment of the present disclosure, the orthographic projection of the second gate 22 on the substrate 10 covers an orthographic projection of at least part of the third contact hole 73 on the substrate 10, and the orthographic projection of the second gate 22 on the substrate 10 covers an orthographic projection of at least part of the fourth contact hole 74 on the substrate 10. Here, since the gate insulating layer 60 covers the second gate 22, the gate insulating layer 60 may form a protrusion (not shown) at the second gate 22, that is, the gate insulating layer 60 may form a step at the edge of the second gate 22. In the embodiment of the present disclosure, even when the portion of the second active portion 32 covering the step is broken, because the second active portion 32 corresponding to the overlapping region of the third contact hole 73, the fourth contact hole 74, and the second gate 22 is located on the flat surface of the protrusion formed by the gate insulating layer 60, the probability that the second active portion 32 corresponding to the overlap region of the third contact hole 73, the fourth contact hole 74, and the second gate 22 is broken may be reduced, so that the second source 43 and the second drain 44 may still be connected to the second active portion 32 through the third contact hole 73 and the fourth contact hole 74, so as to realize transmission of an electrical signal, thereby improving the electrical property and stability of the second transistor T2.

Optionally, the area of the overlapping region between the orthographic projection of the third contact hole 73 on the substrate 10 and the orthographic projection of the second gate 22 on the substrate 10 accounts for half of the area of the orthographic projection of the third contact hole 73 on the substrate 10, and the area of the overlapping region between the orthographic projection of the fourth contact hole 74 on the substrate 10 and the orthographic projection of the second gate 22 on the substrate 10 accounts for half of the area of the orthographic projection of the fourth contact hole 74 on the substrate 10.

Optionally, the orthographic projection of the third contact hole 73 on the substrate 10 is within the coverage of the orthographic projection of the second gate 22 on the substrate 10; alternatively, the orthographic projection of the fourth contact hole 74 on the substrate 10 is within the coverage of the orthographic projection of the second gate 22 on the substrate 10; alternatively, the orthographic projection of the third contact hole 73 on the substrate 10 and the orthographic projection of the fourth contact hole 74 on the substrate 10 are both located within the coverage of the orthographic projection of the second gate 22 on the substrate 10. Therefore, the contact portions of the second active portion 32 with the second source 43 and the second drain 44 may be located on the flat surface of the gate insulating layer 60, so that the probability of breakage of the contact portions of the second active portion 32 with the second source 43 and the second drain 44 is reduced, and the electrical property and the stability of the second transistor T2 are further improved.

Further, referring to FIGS. 1, 3, 4, and 5, FIGS. 3, 4, and 5 are schematic diagrams of the structure of the display panel in the non-display region 102, for example, may be a schematic structural diagram in the GOA driving circuit region. The plurality of thin film transistors in the display panel further include a third transistor T3 disposed in the non-display region 102.

The first metal layer 20 includes a third gate 23 of the third transistor T3, the active layer 30 includes a third active portion 33 of the third transistor T3, and the third active portion 33 is disposed on a side of the third gate 23 away from the substrate 10. The third active portion 33 includes a third channel sub-region 331, a third source contact sub-region 332 and a third drain contact sub-region 333 located on both sides of the third channel sub-region 331, and two third lightly doped regions 334, and the two third lightly doped regions 334 are disposed between the third source contact sub-region 332 and the third channel sub-region 331, and between the third drain contact sub-region 333 and the third channel sub-region 331, respectively. Further, the second transistor T2 shares the second source 43 or the second drain 44 with the third transistor T3. The orthographic projection of the third gate 23 on the active layer 30 covers the third channel sub-region 331, and the boundary of the orthographic projection of the third gate 23 on the active layer 30 is located in the third source contact sub-region 332 and the third drain contact sub-region 333, that is, the boundary of the orthographic projection of the third gate 23 on the substrate 10 does not pass the boundary of the orthographic projection of the third active portion 33 on the substrate 10.

Figure 3:
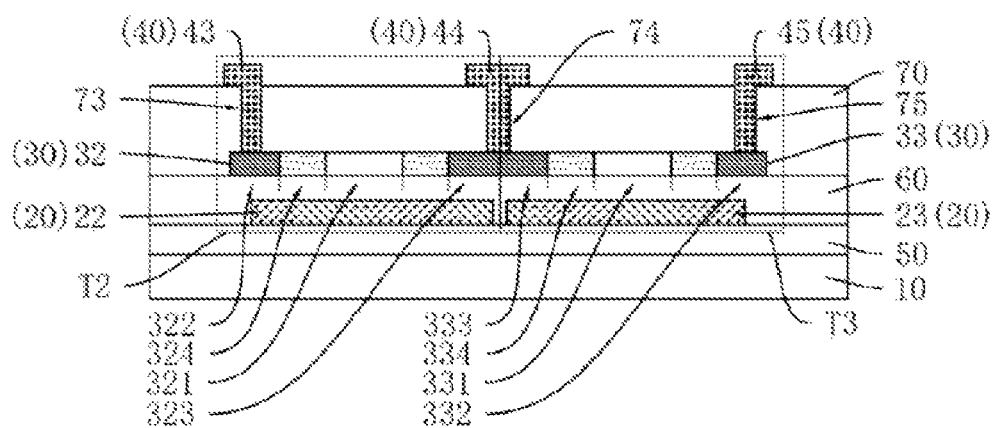
FIG. 3 is a schematic diagram of a structure of a display panel corresponding to a non-display region according to an embodiment of the present disclosure.
Figure 4:
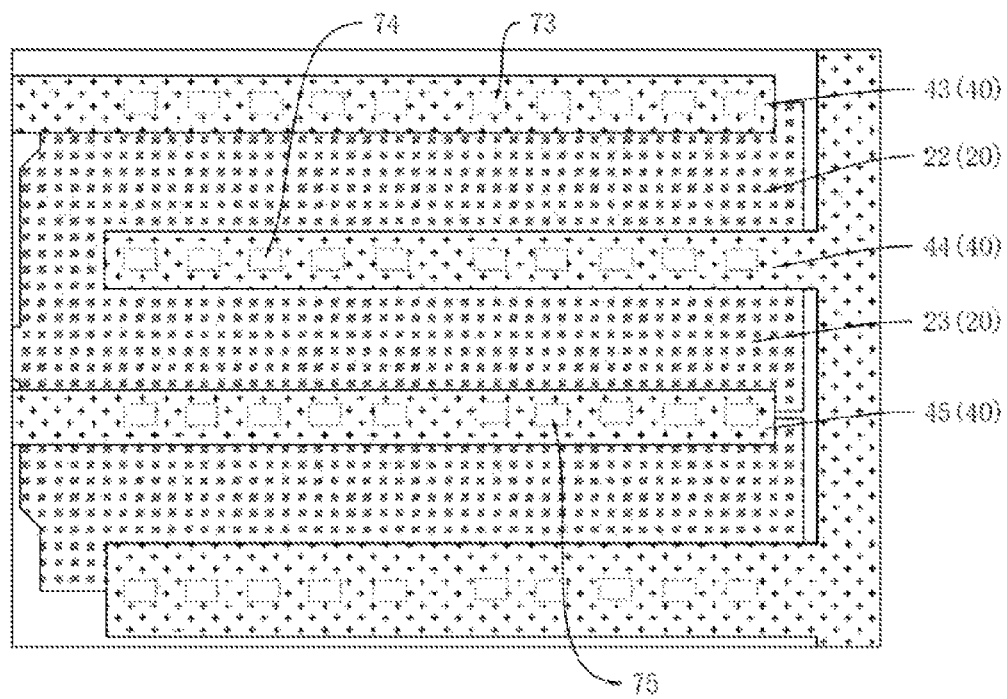
FIG. 4 is a schematic diagram of a planar structure of a display panel corresponding to a non-display region according to an embodiment of the present disclosure.
Figure 5:
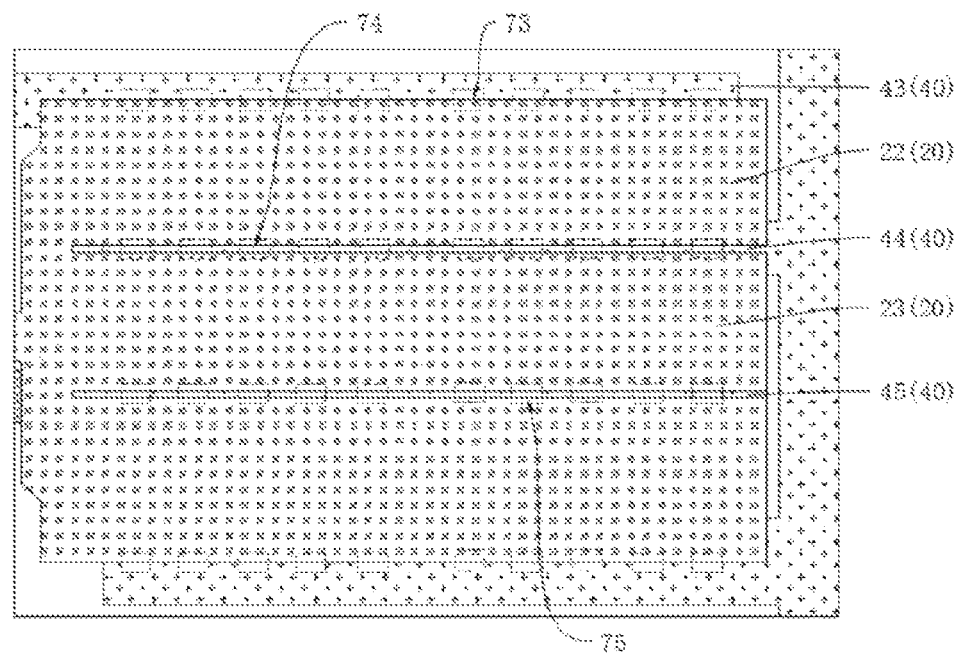
FIG. 5 is a schematic diagram of another planar structure of a display panel corresponding to a non-display region according to an embodiment of the present disclosure.

In the embodiments shown in FIGS. 3, 4 and 5, the second transistor T2 shares the second drain 44 with the third transistor T3. At this time, the second metal layer 40 includes a third source electrode 45 of the third transistor T3, and the third active portion 33 is connected to the second active portion 32. Specifically, a portion of the third active portion 33 located in the third drain contact sub-region 333 is connected to a portion of the second active portion 32 located in the second drain contact sub-region 323, so that the second drain 44 is connected simultaneously to the portion of the second active portion 32 located in the second drain contact sub-region 323 and the portion of the third active portion 33 located in the third drain contact sub-region 333, and thus the second transistor T2 shares the second drain 44 with the third transistor T3.

It should be noted that the second gate 22 and the third gate 23 are arranged at intervals to achieve the purpose of separately controlling the second transistor T2 and the third transistor T3, respectively.

The orthographic projection of the fourth contact hole 74 on the substrate 10 partially overlaps the orthographic projection of the second gate 22 on the substrate 10, and the orthographic projection of the fourth contact hole 74 on the substrate 10 partially overlaps the orthographic projection of the third gate 23 on the substrate 10. Further, the bonding portion between the second active portion 32 and the second drain 44, and the bonding portion of the third active portion 33 and the second drain 44 may be both located on the flat surface of the gate insulating layer 60, so that the probability of breakage of the contact portions of the second active portion 32, the third active portion 33 and the second drain 44 is reduced, and the electrical properties and the stability of the second transistor T2 and the third transistor T3 are further improved.

Further, the spacer layer 70 further includes a fifth contact hole 75 provided corresponding to the third source contact sub-region 332, and the third source 45 is connected to a portion of the third active portion 33 located in the third source contact sub-region 332 through the fifth contact hole 75. The orthographic projection of the third gate 23 on the substrate 10 covers the orthographic projection of at least portion of the fifth contact hole 75 on the substrate 10, so that at least part of the third active portion 33 overlapping the third source 45 may be located on the flat surface of the gate insulating layer 60, thereby reducing the probability of breakage of the contact portion of the third active portion 33 and the third source 45, and further improving the electrical property and stability of the third transistor T3.

Optionally, the orthographic projection of the fifth contact hole 75 on the substrate 10 is located within the coverage area of the orthographic projection of the third gate 23 on the substrate 10, so as to minimize the probability of breakage of the contact portion between the third active portion 33 and the third source 45, and improve the electrical property and stability of the third transistor T3.

From the above, in this embodiment of the present disclosure, by increasing the shielding range of the first gate electrode 21 to the back side of the first active portion 31 and the shielding range of the second gate 22 to the back side of the second active portion 32, the photogenerated leakage currents of the first transistor T1 and the second transistor T2 are effectively reduced, and at the same time, the space occupied by the second transistor T2 in the non-display region 102 is not increased, so that the display panel with the narrow bezel may be realized. Further, at least part of the first active portion 31 connected to the first source 41 and the first drain 42, at least part of the second active portion 32 connected to the second source 43 and the second drain 44, and at least part of the third active portion 33 connected to the third source 45 and the second drain 44 are provided at the flat surface of the gate insulating layer 60, so that the probability that the second active portion 32 and the third active portion 33 are broken at the bonding position with the source and the drain may be effectively reduced, thereby improving the electrical properties and stability of the second transistor T2 and the third transistor T3.

Figure 6:
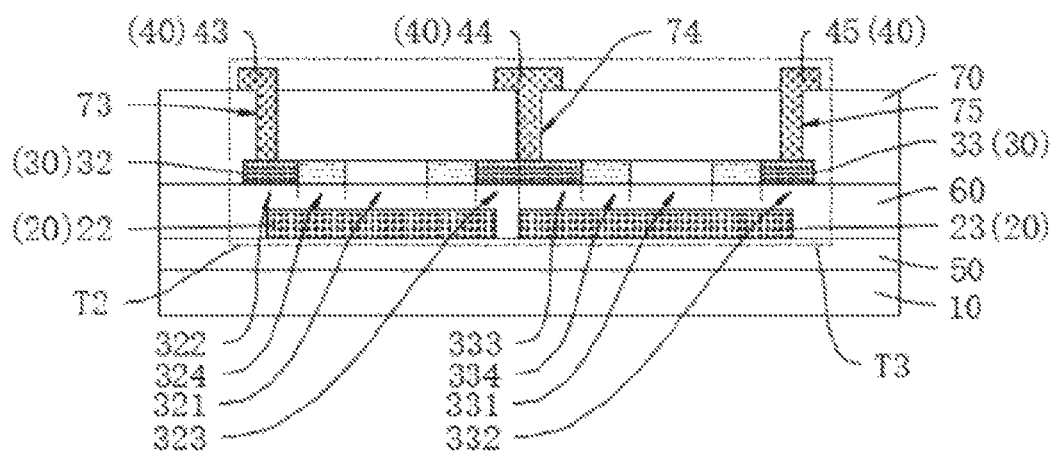
FIG. 6 is a schematic diagram of another structure of a display panel corresponding to a non-display region according to an embodiment of the present disclosure.

In another embodiment of the present disclosure, referring to FIG. 6, the present embodiment differs from the previous embodiment in that in the present embodiment, the orthographic projection of the fourth contact hole 74 on the substrate 10 is within the coverage area of the orthographic projection of the third gate 23 on the substrate 10, and the orthographic projection of the fourth contact hole 74 on the substrate 10 does not overlap the orthographic projection of the second gate 22 on the substrate 10.

From the above, in this embodiment of the present disclosure, by increasing the shielding range of the first gate 21 to the back side of the first active portion 31 and the shielding range of the second gate 22 to the back side of the second active portion 32, the photogenerated leakage currents of the first transistor T1 and the second transistor T2 are effectively reduced, and at the same time, the space occupied by the second transistor T2 in the non-display region 102 is not increased, so that the display panel with the narrow bezel may be realized. Further, in the non-display region 102, at least part of the first active portion 31 connected to the first source 41 and the first drain 42, at least part of the second active portion 32 connected to the second source 43 and the second drain 44, and at least part of the third active portion 33 connected to the third source 45 and the second drain 44 are provided at the flat surface of the gate insulating layer 60, so that the probability that the second active portion 32 and the third active portion 33 are broken at the bonding position with the source and the drain may be effectively reduced, thereby improving the electrical properties and stability of the second transistor T2 and the third transistor T3.

Figure 7:
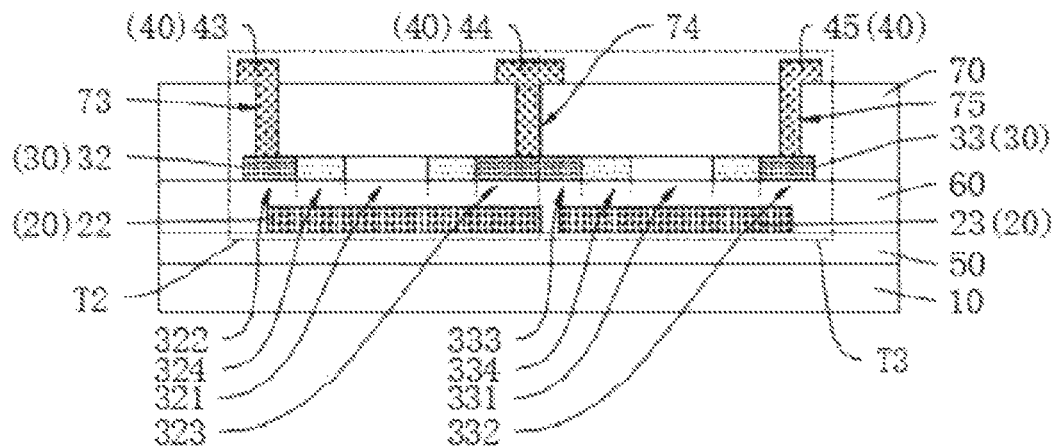
FIG. 7 is a schematic diagram of another structure of a display panel corresponding to a non-display region according to an embodiment of the present disclosure.

In another embodiment of the present disclosure, referring to FIG. 7, the present embodiment differs from the previous embodiment in that in the present embodiment, the orthographic projection of the fourth contact hole 74 on the substrate 10 is within the coverage area of the orthographic projection of the second gate 22 on the substrate 10, and the orthographic projection of the fourth contact hole 74 on the substrate 10 does not overlap the orthographic projection of the third gate 23 on the substrate 10.

From the above, in this embodiment of the present disclosure, by increasing the shielding range of the first gate 21 to the back side of the first active portion 31 and the shielding range of the second gate 22 to the back side of the second active portion 32, the photogenerated leakage currents of the first transistor T1 and the second transistor T2 are effectively reduced, and at the same time, the space occupied by the second transistor T2 in the non-display region 102 is not increased, so that the display panel with the narrow bezel may be realized. Further, in the non-display region 102, at least part of the first active portion 31 connected to the first source 41 and the first drain 42, at least part of the second active portion 32 connected to the second source 43 and the second drain 44, and at least part of the third active portion 33 connected to the third source 45 and the second drain 44 are provided at the flat surface of the gate insulating layer 60, so that the probability that the second active portion 32 and the third active portion 33 are broken at the bonding position with the source and the drain may be effectively reduced, thereby improving the electrical properties and stability of the second transistor T2 and the third transistor T3.

Figure 8:
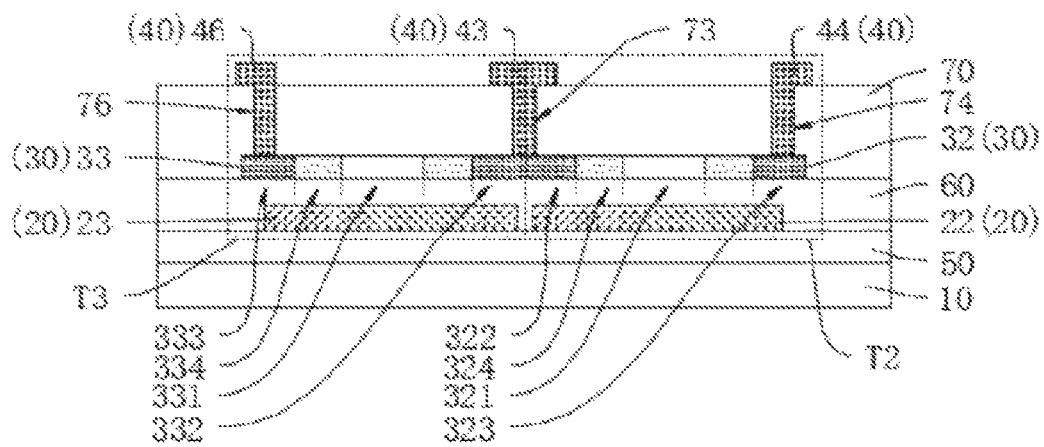
FIG. 8 is a schematic diagram of another structure of a display panel corresponding to a non-display region according to an embodiment of the present disclosure.

In another embodiment of the present disclosure, referring to FIG. 8, the present embodiment differs from the first embodiment in that the second transistor T2 shares the second source 43 with the third transistor T3, and a portion of the second active portion 32 located in the second source contact sub-region 322 is connected to a portion of the third active portion 33 located in the third source contact sub-region 332.

In the present embodiment, the orthographic projection of the third contact hole 73 on the substrate 10 overlaps the orthographic projection of the second gate 22 on the substrate 10, and the orthographic projection of the third contact hole 73 on the substrate 10 overlaps the orthographic projection of the third gate 23 on the substrate 10. Further, the bonding portion of the second active portion 32 and the second source 43, and the bonding portion of the third active portion 33 and the second source 43 may be both located on the flat surface of the gate insulating layer 60, so that the probability of breakage of the contact portions of the second active portion 32, the third active portion 33 and the second source 43 is reduced, and the electrical properties and the stability of the second transistor T2 and the third transistor T3 are further improved.

Further, the second metal layer 40 includes a third drain 46 of the third transistor T3, the spacer layer 70 further includes a sixth contact hole 76 provided corresponding to the third drain contact sub-region 333, and the third drain 46 is connected to a portion of the third active portion 33 located in the third drain contact sub-region 333 through the sixth contact hole 76. An orthographic projection of the third gate 23 on the substrate 10 covers an orthographic projection of at least part of the sixth contact hole 76 on the substrate 10, so that at least part of the third active portion 33 connected to the third drain 46 may be located on a flat surface of the gate insulating layer 60, thereby reducing a probability that the contact portion of the third active portion 33 and the third drain 46 is broken, and further improving the electrical property and stability of the third transistor T3.

Optionally, the orthographic projection of the sixth contact hole 76 on the substrate 10 is located within the coverage area of the orthographic projection of the third gate 23 on the substrate 10, so as to minimize the probability of breakage of the contact portion between the third active portion 33 and the third drain 46, and improve the electrical property and stability of the third transistor T3.

From the above, in this embodiment of the present disclosure, by increasing the shielding range of the first gate 21 to the back side of the first active portion 31 and the shielding range of the second gate 22 to the back side of the second active portion 32, the photogenerated leakage currents of the first transistor T1 and the second transistor T2 are effectively reduced, and at the same time, the space occupied by the second transistor T2 in the non-display region 102 is not increased, so that the display panel with the narrow bezel may be realized. Further, in the non-display region 102, at least part of the first active portion 31 connected to the first source 41 and the first drain 42, at least part of the second active portion 32 connected to the second source 43 and the second drain 44, and at least part of the third active portion 33 connected to the third source 45 and the second drain 44 are provided at the flat surface of the gate insulating layer 60, so that the probability that the second active portion 32 and the third active portion 33 are broken at the bonding position with the source and the drain may be effectively reduced, thereby improving the electrical properties and stability of the second transistor T2 and the third transistor T3.

Figure 9:
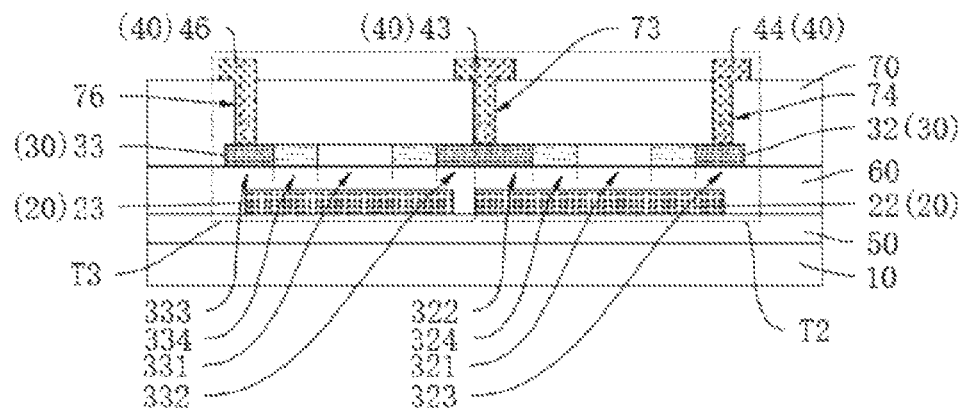
FIG. 9 is a schematic diagram of another structure of a display panel corresponding to a non-display region according to an embodiment of the present disclosure.

In another embodiment of the present disclosure, referring to FIG. 9, the present embodiment differs from the previous embodiment in that in the present embodiment, the orthographic projection of the third contact hole 73 on the substrate 10 is within the coverage area of the orthographic projection of the second gate 22 on the substrate 10, and the orthographic projection of the third contact hole 73 on the substrate 10 does not overlap the orthographic projection of the third gate 23 on the substrate 10.

From the above, in this embodiment of the present disclosure, by increasing the shielding range of the first gate 21 to the back side of the first active portion 31 and the shielding range of the second gate 22 to the back side of the second active portion 32, the photogenerated leakage currents of the first transistor T1 and the second transistor T2 are effectively reduced, and at the same time, the space occupied by the second transistor T2 in the non-display region 102 is not increased, so that the display panel with the narrow bezel may be realized. Further, in the non-display region 102, at least part of the first active portion 31 connected to the first source 41 and the first drain 42, at least part of the second active portion 32 connected to the second source 43 and the second drain 44, and at least part of the third active portion 33 connected to the third source 45 and the second drain 44 are provided at the flat surface of the gate insulating layer 60, so that the probability that the second active portion 32 and the third active portion 33 are broken at the bonding position with the source and the drain may be effectively reduced, thereby improving the electrical properties and stability of the second transistor T2 and the third transistor T3.

Figure 10:
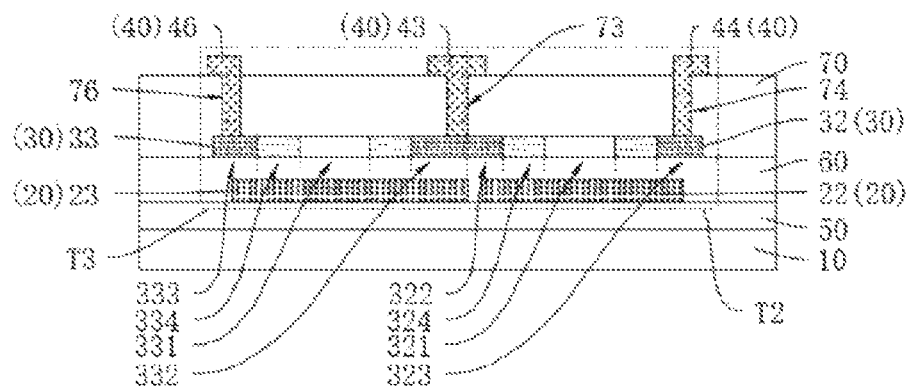
FIG. 10 is a schematic diagram of another structure of a display panel corresponding to a non-display region according to an embodiment of the present disclosure.

In another embodiment of the present disclosure, referring to FIG. 10, the present embodiment differs from the previous embodiment in that in the present embodiment, the orthographic projection of the third contact hole 73 on the substrate 10 is within the coverage area of the orthographic projection of the third gate 23 on the substrate 10, and the orthographic projection of the third contact hole 73 on the substrate 10 does not overlap the orthographic projection of the second gate 22 on the substrate 10.

From the above, in this embodiment of the present disclosure, by increasing the shielding range of the first gate 21 to the back side of the first active portion 31 and the shielding range of the second gate 22 to the back side of the second active portion 32, the photogenerated leakage currents of the first transistor T1 and the second transistor T2 are effectively reduced, and at the same time, the space occupied by the second transistor T2 in the non-display region 102 is not increased, so that the display panel with the narrow bezel may be realized. Further, in the non-display region 102, at least part of the first active portion 31 connected to the first source 41 and the first drain 42, at least part of the second active portion 32 connected to the second source 43 and the second drain 44, and at least part of the third active portion 33 connected to the third source 45 and the second drain 44 are provided at the flat surface of the gate insulating layer 60, so that the probability that the second active portion 32 and the third active portion 33 are broken at the bonding position with the source and the drain may be effectively reduced, thereby improving the electrical properties and stability of the second transistor T2 and the third transistor T3.

In addition, an embodiment of the present disclosure further provides a display device including a device body and a display panel.

The device body may include a middle frame, a frame glue, and the like, and the display device may be a display terminal such as a mobile phone, a tablet, or a television, which is not limited herein.

In the above-mentioned embodiments, the description of each embodiment has its own emphasis, and parts not described in detail in a certain embodiment may be referred to the related description of other embodiments.

A display panel and a display device according to an embodiment of the present disclosure are described in detail above. The principles and implementations of the present disclosure are described in detail here with specific examples. The above description of the embodiments is merely intended to help understand the technical solution and core ideas of the present disclosure. Those of ordinary skill in the art should understand that it is still possible to modify the technical solutions recorded in the foregoing embodiments, and these modifications or replacements do not cause the essence of the corresponding technical solutions to deviate from the scope of the technical solutions of the embodiments of the present disclosure.

What is claimed is:

1. A display panel, wherein the display panel comprises a display region, a non-display region adjacent to the display region, a first transistor disposed in the display region, and a second transistor disposed in the non-display region, and the display panel further comprises:
   a substrate;
   a first metal layer disposed on the substrate and comprising a first gate of the first transistor and a second gate of the second transistor;
   an active layer disposed on a side of the first metal layer away from the substrate and comprising a first active portion of the first transistor and a second active portion of the second transistor, wherein the first active portion is located on a side of the first gate away from the substrate, and the second active portion is located on a side of the second gate away from the substrate;
   a spacer layer disposed on a side of the active layer away from the first metal layer and comprising a plurality of contact holes; and
   a second metal layer disposed on a side of the spacer layer away from the active layer and comprising a first source and a first drain of the first transistor, and a second source and a second drain of the second transistor, wherein the plurality of contact holes comprise a first contact hole, a second contact hole, a third contact hole and a fourth contact hole, the first source is connected to the first active portion through the first contact hole, the first drain is connected to the first active portion through the second contact hole, the second source is connected to the second active portion through the third contact hole, and the second drain is connected to the second active portion through the fourth contact hole; and
   wherein both an orthographic projection of the first contact hole on the substrate and an orthographic projection of the second contact hole on the substrate are located within a coverage area of an orthographic projection of the first gate on the substrate, a boundary of the orthographic projection of the second gate on the substrate does not extend beyond a boundary of an orthographic projection of the second active portion on the substrate, and both a boundary of an orthographic projection of the third contact hole on the substrate and a boundary of an orthographic projection of the fourth contact hole on the substrate extend beyond the boundary of the orthographic projection of the second gate on the substrate.

2. The display panel according to claim 1, wherein an orthographic projection of the first active portion on the substrate is located within the coverage area of the orthographic projection of the first gate on the substrate.

3. The display panel according to claim 1, wherein the first metal layer further comprises a scan line connected to the first gate, and a width of the first gate in a first direction is larger than a width of the scan line in the first direction, and the first direction is perpendicular to an extending direction of the scan line.

4. The display panel according to claim 1, wherein the thin film transistor further comprises a third transistor disposed in the non-display region, the first metal layer comprises a third gate of the third transistor, the active layer comprises a third active portion of the third transistor, the third active portion is disposed on a side of the third gate away from the substrate, and a boundary of an orthographic projection of the third gate on the substrate does not extend beyond a boundary of an orthographic projection of the third active portion on the substrate; and wherein the second transistor and the third transistor share the second source or the second drain.

5. The display panel according to claim 4, wherein the second metal layer comprises a third source of the third transistor, the third transistor shares the second drain with the second transistor, and the third active portion is connected to the second active portion; and wherein an orthographic projection of the fourth contact hole on the substrate partially overlaps the orthographic projection of the second gate on the substrate, and the orthographic projection of the fourth contact hole on the substrate partially overlaps the orthographic projection of the third gate on the substrate.

6. The display panel according to claim 5, wherein the plurality of contact holes further comprises a fifth contact hole, the third source is connected to the third active portion through the fifth contact hole, and the orthographic projection of the third gate on the substrate covers an orthographic projection of at least part of the fifth contact hole on the substrate.

7. The display panel according to claim 4, wherein the second metal layer comprises a third drain of the third transistor, the third transistor shares the second source with the second transistor, and the third active portion is connected to the second active portion; and wherein an orthographic projection of the third contact hole on the substrate partially overlaps the orthographic projection of the second gate on the substrate, and the orthographic projection of the third contact hole on the substrate partially overlaps the orthographic projection of the third gate on the substrate.

8. The display panel according to claim 7, wherein the plurality of contact holes further comprises a sixth contact hole, the third drain is connected to the third active portion through the sixth contact hole, and the orthographic projection of the third gate on the substrate covers an orthographic projection of at least part of the sixth contact hole on the substrate.

9. The display panel according to claim 4, wherein the second gate is spaced from the third gate.

10. The display panel according to claim 4, wherein the second transistor shares the second source with the third transistor, and an orthographic projection of the third contact hole on the substrate is located within a coverage area of the orthographic projection of the second gate on the substrate, or the orthographic projection of the third contact hole on the substrate is located within a coverage area of the orthographic projection of the third gate on the substrate.

11. The display panel according to claim 4, wherein the second transistor shares the second drain with the third transistor, and an orthographic projection of the fourth contact hole on the substrate is located within a coverage area of the orthographic projection of the second gate on the substrate, or the orthographic projection of the fourth contact hole on the substrate is located within a coverage area of the orthographic projection of the third gate on the substrate.

12. A display device, wherein the display device comprises a display panel, the display panel comprises a display region, a non-display region adjacent to the display region, a first transistor disposed in the display region, and a second transistor disposed in the non-display region, and the display panel further comprises:
a substrate;
a first metal layer disposed on the substrate and comprising a first gate of the first transistor and a second gate of the second transistor;
an active layer disposed on a side of the first metal layer away from the substrate and comprising a first active portion of the first transistor and a second active portion of the second transistor, wherein the first active portion is located on a side of the first gate away from the substrate, and the second active portion is located on a side of the second gate away from the substrate;
a spacer layer disposed on a side of the active layer away from the first metal layer and comprising a plurality of contact holes; and
a second metal layer disposed on a side of the spacer layer away from the active layer and comprising a first source and a first drain of the first transistor, and a second source and a second drain of the second transistor, wherein the plurality of contact holes comprise a first contact hole, a second contact hole, a third contact hole and a fourth contact hole, the first source is connected to the first active portion through the first contact hole, the first drain is connected to the first active portion through the second contact hole, the second source is connected to the second active portion through the third contact hole, and the second drain is connected to the second active portion through the fourth contact hole; and
wherein both an orthographic projection of the first contact hole on the substrate and an orthographic projection of the second contact hole on the substrate are located within a coverage area of an orthographic projection of the first gate on the substrate, a boundary of the orthographic projection of the second gate on the substrate does not extend beyond a boundary of an orthographic projection of the second active portion on the substrate, and both a boundary of an orthographic projection of the third contact hole on the substrate and a boundary of an orthographic projection of the fourth contact hole on the substrate extend beyond the boundary of the orthographic projection of the second gate on the substrate.

13. The display device according to claim 12, wherein the thin film transistor further comprises a third transistor disposed in the non-display region, the first metal layer comprises a third gate of the third transistor, the active layer comprises a third active portion of the third transistor, the third active portion is disposed on a side of the third gate away from the substrate, and a boundary of an orthographic projection of the third gate on the substrate does not extend beyond a boundary of an orthographic projection of the third active portion on the substrate; and wherein the second transistor and the third transistor share the second source or the second drain.

14. The display device according to claim 13, wherein the second metal layer comprises a third source of the third transistor, the third transistor shares the second drain with the second transistor, and the third active portion is connected to the second active portion; and wherein an orthographic projection of the fourth contact hole on the substrate partially overlaps the orthographic projection of the second gate on the substrate, and the orthographic projection of the fourth contact hole on the substrate partially overlaps the orthographic projection of the third gate on the substrate.

15. The display device according to claim 14, wherein the plurality of contact holes further comprises a fifth contact hole, the third source is connected to the third active portion through the fifth contact hole, and the orthographic projection of the third gate on the substrate covers an orthographic projection of at least part of the fifth contact hole on the substrate.

16. The display device according to claim 13, wherein the second metal layer comprises a third drain of the third transistor, the third transistor shares the second source with the second transistor, and the third active portion is connected to the second active portion; and wherein an orthographic projection of the third contact hole on the substrate partially overlaps the orthographic projection of the second gate on the substrate, and the orthographic projection of the third contact hole on the substrate partially overlaps the orthographic projection of the third gate on the substrate.

17. The display device according to claim 16, wherein the plurality of contact holes further comprises a sixth contact hole, the third drain is connected to the third active portion through the sixth contact hole, and the orthographic projection of the third gate on the substrate covers an orthographic projection of at least part of the sixth contact hole on the substrate.

18. The display device according to claim 13, wherein the second gate is spaced from the third gate.

19. The display device according to claim 13, wherein the second transistor shares the second source with the third transistor, and an orthographic projection of the third contact hole on the substrate is located within a coverage area of the orthographic projection of the second gate on the substrate, or the orthographic projection of the third contact hole on the substrate is located within a coverage area of the orthographic projection of the third gate on the substrate.

20. The display device according to claim 13, wherein the second transistor shares the second drain with the third transistor, and an orthographic projection of the fourth contact hole on the substrate is located within a coverage area of the orthographic projection of the second gate on the substrate, or the orthographic projection of the fourth contact hole on the substrate is located within a coverage area of the orthographic projection of the third gate on the substrate.

* * * * *